(12) United States Patent
Tsai et al.

(10) Patent No.: US 11,690,217 B2
(45) Date of Patent: Jun. 27, 2023

(54) DYNAMIC RANDOM ACCESS MEMORY WITH ADHESION LAYER AND METHOD OF MANUFACTURING THE SAME

(71) Applicant: Winbond Electronics Corp., Taichung (TW)

(72) Inventors: Shou-Chi Tsai, Taichung (TW); Chun-Lin Li, Taichung (TW)

(73) Assignee: Winbond Electronics Corp., Taichung (TW)

( * ) Notice: Subject to any disclaimer, the term of this patent is extended or adjusted under 35 U.S.C. 154(b) by 80 days.

(21) Appl. No.: 17/368,819

(22) Filed: Jul. 6, 2021

(65) Prior Publication Data

US 2023/0009397 A1 Jan. 12, 2023

(51) Int. Cl.
*H10B 12/00* (2023.01)

(52) U.S. Cl.
CPC ........... *H10B 12/34* (2023.02); *H10B 12/053* (2023.02)

(58) Field of Classification Search
CPC ................... H01L 27/10823; H01L 27/10876
USPC ....................................................... 257/330
See application file for complete search history.

(56) References Cited

U.S. PATENT DOCUMENTS

| 2015/0214314 A1* | 7/2015 | Oh ..................... H01L 21/28114 257/330 |
| 2017/0271464 A1 | 9/2017 | Jang |
| 2021/0043632 A1 | 2/2021 | Chang et al. |

FOREIGN PATENT DOCUMENTS

| KR | 101095802 | 12/2011 |
| KR | 20160073143 | 6/2016 |
| TW | 201310581 | 3/2013 |
| TW | 201545352 | 12/2015 |
| TW | 201826398 | 7/2018 |

OTHER PUBLICATIONS

"Office Action of Taiwan Counterpart Application", dated Apr. 25, 2022, p. 1-p. 6.

* cited by examiner

*Primary Examiner* — Hoai V Pham
(74) *Attorney, Agent, or Firm* — JCIPRNET

(57) ABSTRACT

Provided is a dynamic random access memory including a substrate, a gate dielectric layer, a metal filling layer, an adhesion layer, multiple work function layers, and multiple doped regions. The substrate has a trench. The gate dielectric layer is located on a sidewall and a bottom surface of the trench. The metal filling layer is located in the trench. The adhesion layer is located between the gate dielectric layer and the metal filling layer. The work function layers are located in the trench, where each work function layer is located between a sidewall of the gate dielectric layer and a sidewall of the adhesion layer. The doped regions are located in the substrate on both sides of the trench, where part of the work function layers and part of the gate dielectric layer are laterally sandwiched between part of the doped regions and part of the adhesion layer.

14 Claims, 4 Drawing Sheets

DYNAMIC RANDOM ACCESS MEMORY WITH ADHESION LAYER AND METHOD OF MANUFACTURING THE SAME

BACKGROUND

Technical Field

The disclosure relates to an integrated circuit and a method of manufacturing the same, and more particularly to a dynamic random access memory and a method of manufacturing the same.

Description of Related Art

Performance of a dynamic random access memory directly affects its output and related specifications, such as write recovery time (tWR) and refresh performance. However, as the size of the dynamic random access memory continues to shrink, and semiconductor devices continues to be developed toward high degree of integration, the performance of the dynamic random access memory is also decreased. Therefore, how to maintain or improve the performance of the dynamic random access memory become an urgent problem to be solved in this field.

SUMMARY

An embodiment of the disclosure provides a dynamic random access memory and a method of manufacturing the same, which may reduce gate induced drain leakage (GIDL) and may improve write recovery time.

The embodiment of the disclosure provides a dynamic random access memory, including a substrate, a gate dielectric layer, a metal filling layer, an adhesion layer, multiple work function layers, and multiple doped regions. The substrate has a trench. The gate dielectric layer is located on a sidewall and a bottom surface of the trench. The metal filling layer is located in the trench. The adhesion layer is located between the gate dielectric layer and the metal filling layer. The work function layers are located in the trench, where each of the work function layers is located between a sidewall of the gate dielectric layer and a sidewall of the adhesion layer. The doped regions are located in the substrate on both sides of the trench, where part of the work function layers and part of the gate dielectric layer are laterally sandwiched between part of the doped regions and part of the adhesion layer.

The embodiment of the disclosure provides a method of manufacturing a dynamic random access memory, including the following steps. A substrate is provided. A trench is formed in the substrate. A gate dielectric layer is formed on a sidewall and a bottom surface of the trench. Multiple work function layers are formed on a sidewall of the gate dielectric layer. An adhesion layer is formed on a sidewall of the work function layers and on the gate dielectric layer on the bottom surface of the trench. The trench is filled with a metal filling layer. Multiple doped regions are formed in the substrate on both sides of the trench, where part of the work function layers and part of the gate dielectric layer are laterally sandwiched between part of the doped regions and part of the adhesion layer.

Based on the above, the dynamic random access memory and the method of manufacturing the same in the embodiment of the disclosure may reduce the GIDL and may improve the write recovery time.

DESCRIPTION OF THE EMBODIMENTS

Figure 1A:
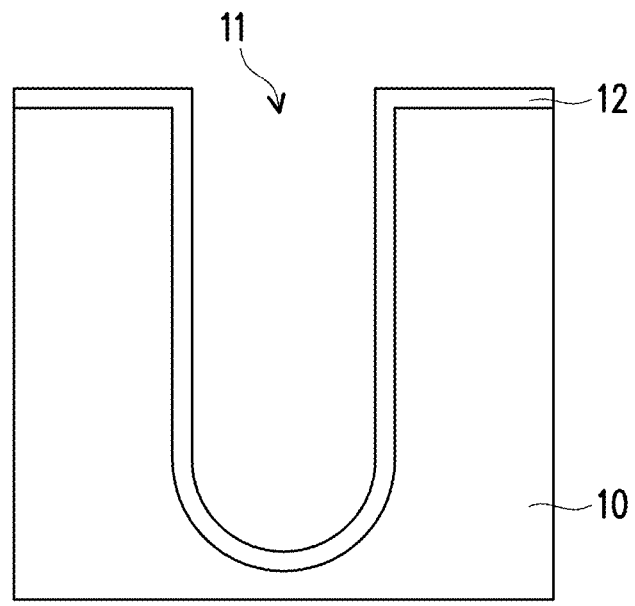
FIGS. 1A to 1H are schematic cross-sectional views of a method of manufacturing a dynamic random access memory according to an embodiment of the disclosure.

With reference to FIG. 1A, a substrate 10, such as a silicon substrate, is provided. Next, a trench 11 is formed in the substrate 10. The trench 11 may form a hardmask material layer on the substrate 10. In following, the hardmask material layer is patterned to form a hardmask layer through a photolithography process and an etching process. With the hardmask layer as a mask to perform the etching process, the substrate 10 is partially removed to form the trench 11, and then the hardmask layer is removed. The trench 11 is, for example, a buried word line trench.

With reference to FIG. 1A, a gate dielectric material layer 12 is formed in the trench 11. The gate dielectric material layer 12 is conformally formed on an inner surface of the trench 11. The gate dielectric material layer 12 may be an oxide layer, such as silicon oxide, and a thermal oxidation process is further performed to allow oxygen to pass through a chemically deposited layer of silicon oxide for reacting with the substrate 10 on a surface of the trench 11 to form another layer of silicon oxide.

Figure 1B:
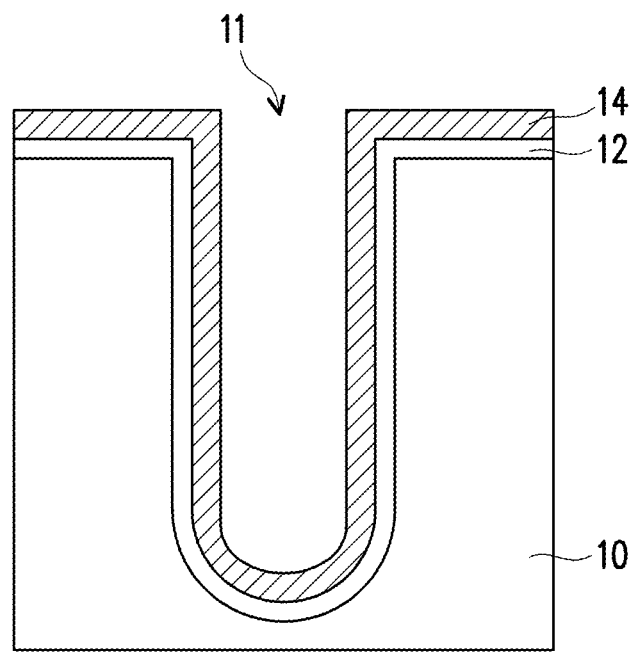

With reference to FIG. 1B, a work function material layer 14 is formed on the gate dielectric material layer 12. The work function material layer 14 and an adhesion material layer 16 (shown in FIG. 1D) subsequently formed have different work functions. The work function of the work function material layer 14 is smaller than the work function of the adhesion material layer 16. The work function material layer 14 includes a semiconductor, such as a doped polysilicon, an undoped polysilicon, or a combination thereof.

Figure 1C:
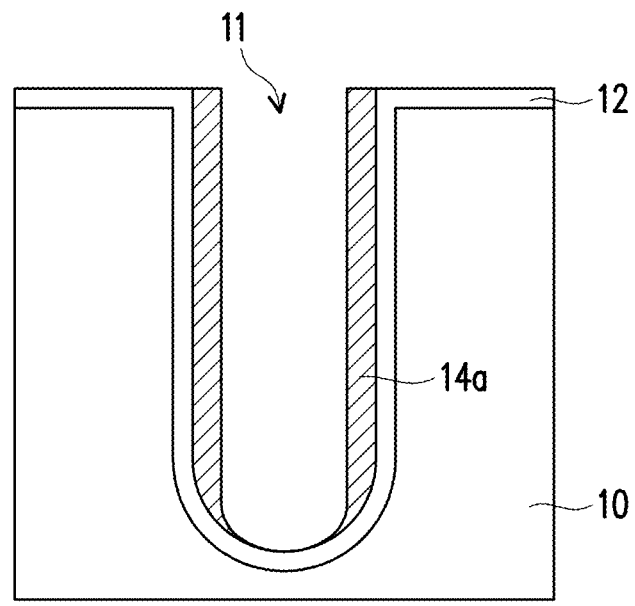

With reference to FIG. 1C, an anisotropic etching process is performed to remove the work function material layer 14 covering the dielectric material layer 12 on a bottom surface of the trench 11 to leave two work function layers 14a separated from each other in the trench 11. The work function layers 14a respectively cover a sidewall of the gate dielectric material layer 12 on a sidewall of the trench 11 and expose the gate dielectric material layer 12 on the bottom surface of the trench 11.

Figure 1D:
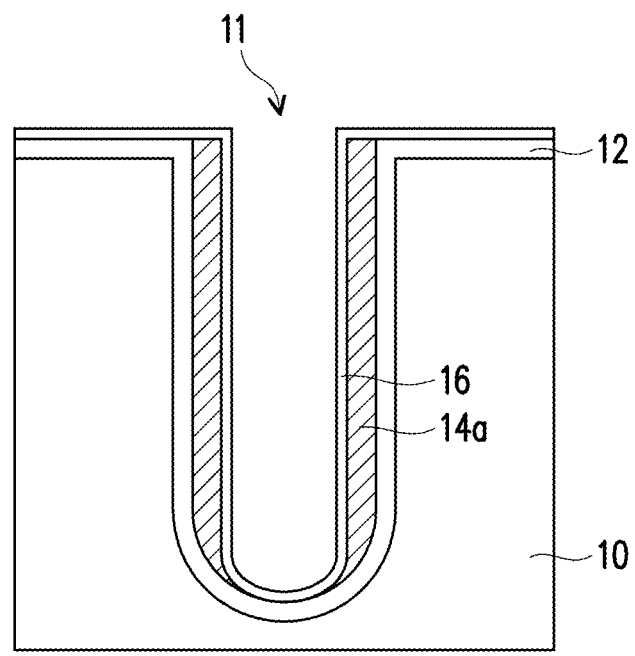

With reference to FIG. 1D, an adhesion material layer 16 is formed on sidewalls of the work function layers 14a and on the gate dielectric material layer 12 on the bottom surface of the trench 11. The work function of the adhesion material layer 16 is greater than the work function of the work function layer 14a. The adhesion material layer 16 may also be referred to as a barrier material layer or a buffer material layer. The adhesion material layer 16 includes metal, metal nitride, or a combination thereof. The adhesion material layer 16 is, for example, titanium, titanium nitride, tantalum, tantalum nitride, or a combination thereof.

With reference to FIG. 1D, a metal fill material layer 18 is formed on the substrate 10 and is filled into the remaining space of the trench 11. The metal fill material layer 18 is metal or metal alloy, such as tungsten.

Figure 1E:
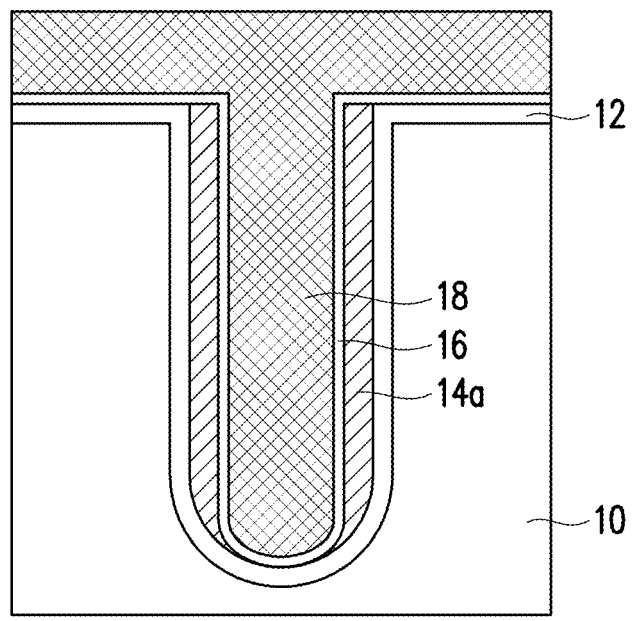
Figure 1F:
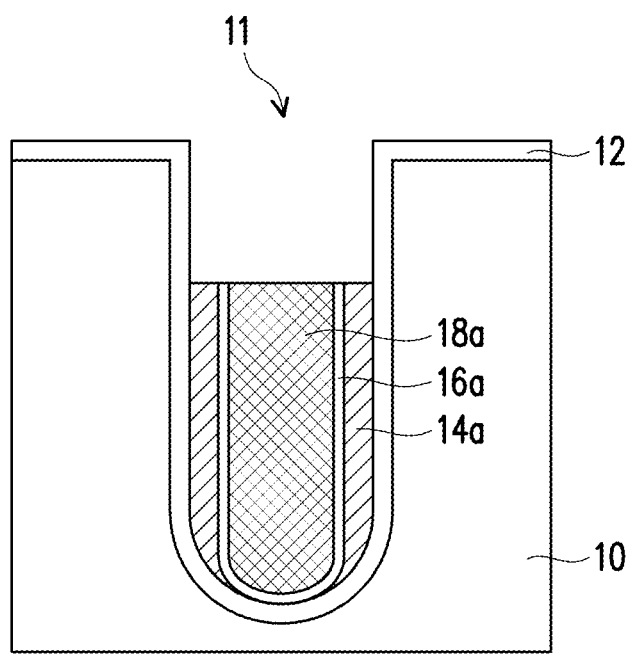

With reference to FIG. 1E, one or more etching processes are performed to remove part of the metal fill material layer 18, the adhesion material layer 16, and the work function material layer 14, leaving a metal filling layer 18a, an adhesion layer 16a, and the work function layers 14a in an lower part of the trench 11.

Figure 1G:
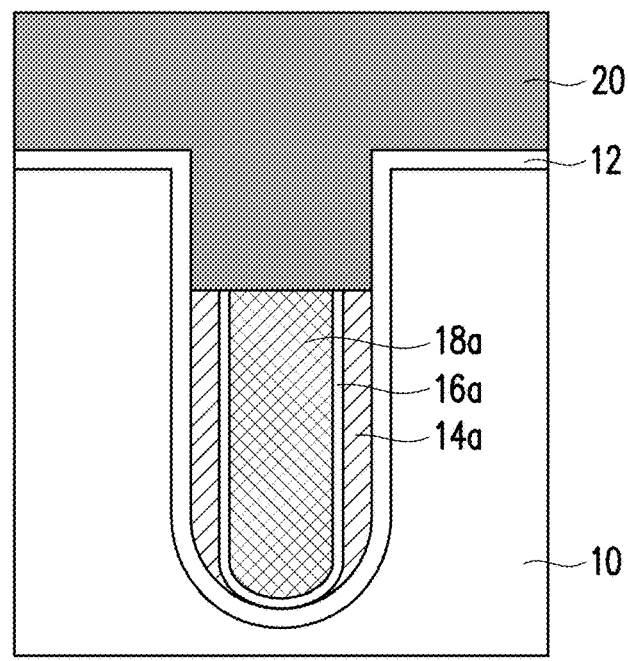

With reference to FIG. 1G, a cap material layer 20 is formed on the substrate 10 and is filled into the remaining space of the trench 11. The cap material layer 20 is a dielectric material, such as silicon nitride, silicon oxide, silicon nitride, or a combination thereof.

Figure 1H:
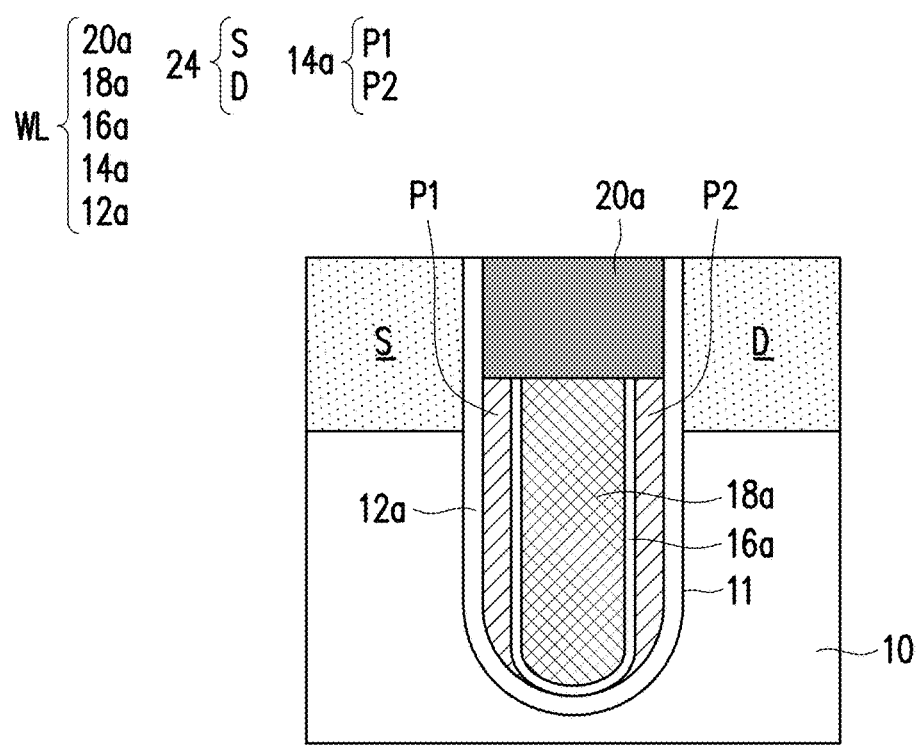

With reference to FIG. 1H, an etching back process or a chemical mechanical polishing process is performed to remove the cap material layer 20 and the gate dielectric material layer 12 outside the trench 11, leaving a cap layer 20a and a gate dielectric layer 12a in the trench 11. The cap layer 20a covers and contacts top surfaces of the metal filling layer 18a, the adhesion layer 16a, the work function layers 14a, and the gate dielectric layer 12a. The cap layer 20a, the metal filling layer 18a, the adhesion layer 16a, the work function layers 14a, and the gate dielectric layer 12a form a buried word line structure WL. The buried word line structure WL includes dual work function layers, where the work function layers 14a may be referred to as a first work function layer, and the adhesion layer 16a may be referred to as a second work function layer.

Next, multiple doped regions 24 are formed in the substrate 10 on both sides of the trench 11. The doped region 24 is, for example, a lightly doped drain/source (LDD) region.

In this embodiment, the work function layers 14a include a first part P1 and a second part P2 separated from each other, and the first part P1 and the second part P2 are work function layers perpendicular to a surface of the substrate 10. The doped region 24 includes a first doped region S and a second doped region D separated from each other by the buried word line structure WL. The first part P1 of the work function layers 14a, part of the gate dielectric layer 12a, part of the adhesion layer 16a, and the first doped region S overlap laterally. The first part P1 of the work function layers 14a and part of the gate dielectric layer 12a are laterally sandwiched between the first doped region S and part of the adhesion layer 16a. The second part P2 of the work function layers 14a, part of the gate dielectric layer 12a, part of the adhesion layer 16a, and the second doped region D overlap laterally. The second part P2 of the work function layers 14a and another part of the gate dielectric layer 12a are laterally sandwiched between the second doped region D and another part of the adhesion layer 16a.

The first part P1 of the work function layers 14a is closer to the gate dielectric layer 12a than the adhesion layer 16a, and the second part P2 of the work function layers 14a is also closer to the gate dielectric layer 12a than the adhesion layer 16a. The first part P1 and the second part P2 of the work function layers 14a are in contact with a sidewall of the gate dielectric layer 12a, respectively. A sidewall of the adhesion layer 16a and the sidewall of the gate dielectric layer 12a are separated by the first part P1 and the second part P2 of the work function layers 14a, and a bottom surface of the adhesion layer 16a is in contact with the gate dielectric layer 12a.

Since the work function layers 14a are closer to the gate dielectric layer 12a than the adhesion layer 16a, and the work function of the work function layers 14a is smaller than the work function of the adhesion layer 16a, the induced electric field may be reduced, gate induced drain leakage (GIDL) may be reduced, and write recovery time (tWR) may be improved.

Furthermore, due to the small work function of the work function layer 14a, the work function layers 14a, the gate dielectric layer 12a, and the doped region 24 may have a larger area for overlapping laterally without causing excessive GIDL, and may thereby increase conduction current.

On the other hand, since the work function layers 14a are formed on the sidewall of the gate dielectric layer 12a, with the ends of the sidewall in contact with the cap layer 20a and far away from the bottom corner of the doped region 24, the electric field at the corner may be reduced.

In addition, the height of the work function layers 14a formed on the sidewall of the gate dielectric layer 12a may be easily controlled by etching back, and thus the difficulty of the process may be reduced.

What is claimed is:

1. A dynamic random access memory, comprising:
   a substrate, having a trench;
   a gate dielectric layer, located on a sidewall and a bottom surface of the trench;
   a metal filling layer, located in the trench;
   an adhesion layer, located between the gate dielectric layer and the metal filling layer;
   a plurality of work function layers, located in the trench, wherein each of the plurality of the work function layers is located between a sidewall of the gate dielectric layer and a sidewall of the adhesion layer; and
   a plurality of doped regions, located in the substrate on both sides of the trench, wherein part of the plurality of the work function layers and part of the gate dielectric layer are laterally sandwiched between part of the plurality of doped regions and part of the adhesion layer,
   wherein one of the plurality of work function layers has an upper portion and a bottom portion, and a thickness of the upper portion is larger than a thickness of the bottom portion.

2. The dynamic random access memory according to claim 1, wherein a work function of the plurality of work function layers is smaller than a work function of the adhesion layer.

3. The dynamic random access memory according to claim 2, wherein the plurality of work function layers comprise a plurality of semiconductor layers.

4. The dynamic random access memory according to claim 3, wherein the plurality of work function layers comprise polysilicon, doped polysilicon, or a combination thereof.

5. The dynamic random access memory according to claim 1, wherein the plurality of work function layers are closer to the plurality of doped regions than the adhesion layer.

6. The dynamic random access memory according to claim 1, further comprising a cap layer in contact with the metal filling layer, the adhesion layer, and a top surface of the plurality of work function layers.

7. The dynamic random access memory according to claim 1, wherein the trench has rounded bottom corners.

8. The dynamic random access memory according to claim 1, wherein the metal filling layer has rounded bottom corners.

9. A method of manufacturing a dynamic random access memory, comprising:
   providing a substrate;
   forming a trench in the substrate;
   forming a gate dielectric layer on a sidewall and a bottom surface of the trench;
   forming a plurality of work function layers on a sidewall of the gate dielectric layer, wherein one of the plurality of work function layers has an upper portion and a bottom portion, and a thickness of the upper portion is larger than a thickness of the bottom portion;

forming an adhesion layer on a sidewall of the plurality of work function layers and on the gate dielectric layer on the bottom surface of the trench;

filling the trench with a metal filling layer; and forming a plurality of doped regions in the substrate on both sides of the trench, wherein part of the plurality of the work function layers and part of the gate dielectric layer are laterally sandwiched between part of the plurality of doped regions and part of the adhesion layer.

10. The method of manufacturing the dynamic random access memory according to claim 9, wherein a method of forming the plurality of work function layers comprises:

forming a work function material layer covering the gate dielectric layer; and removing the work function material layer covering the gate dielectric layer on the bottom surface of the trench to form the plurality of work function layers, wherein the work function material layer is not covered by a material layer during the removing the work function material layer.

11. The method of manufacturing the dynamic random access memory according to claim 9, wherein the plurality of work function layers are formed before the adhesion layer is formed.

12. The method of manufacturing the dynamic random access memory according to claim 9, further comprising:

forming a cap layer in the trench to cover the metal filling layer, the adhesion layer, and the plurality of work function layers.

13. The method of manufacturing the dynamic random access memory according to claim 9, wherein the trench has rounded bottom corners.

14. The method of manufacturing the dynamic random access memory according to claim 9, wherein the metal filling layer has rounded bottom corners.

* * * * *